(12) United States Patent
Shapiro et al.

(10) Patent No.: US 11,075,612 B2
(45) Date of Patent: **\*Jul. 27, 2021**

(54) INTEGRATED AND COMBINED PHASE SHIFTER AND ISOLATION SWITCH

(71) Applicant: pSemi Corporation, San Diego, CA (US)

(72) Inventors: Eric S. Shapiro, San Diego, CA (US); Peter Bacon, Derry, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/893,958

(22) Filed: Jun. 5, 2020

(65) Prior Publication Data

US 2020/0373898 A1 Nov. 26, 2020

Related U.S. Application Data

(60) Continuation of application No. 16/177,097, filed on Oct. 31, 2018, now Pat. No. 10,693,435, which is a division of application No. 15/018,188, filed on Feb. 8, 2016, now Pat. No. 10,141,910.

(51) Int. Cl.
  *H03H 7/20* (2006.01)
(52) U.S. Cl.
  CPC ..................... *H03H 7/20* (2013.01)
(58) Field of Classification Search
  CPC .......................................................... H03H 7/20
  USPC ......................................................... 333/164
  See application file for complete search history.

(56) References Cited

U.S. PATENT DOCUMENTS

| | | |
|---|---|---|
| 3,522,556 A | 8/1970 | Ragan |
| 5,166,648 A | 11/1992 | Wen et al. |
| 6,424,214 B2 | 7/2002 | Sera et al. |
| 6,545,563 B1 | 4/2003 | Smith |
| 10,141,910 B2 | 11/2018 | Shapiro et al. |
| 10,693,435 B2 | 6/2020 | Shapiro et al. |

(Continued)

OTHER PUBLICATIONS

Glenn, Kimberly E., Office Action received from the USPTO dated Jan. 30, 2018 for U.S. Appl. No. 15/018,188, 7 pgs.

(Continued)

*Primary Examiner* — Robert J Pascal
*Assistant Examiner* — Kimberly E Glenn
(74) *Attorney, Agent, or Firm* — Jaquez Land Greenhaus & McFarland LLP; John Land, Esq.

(57) ABSTRACT

A phase shifter unit cell or a connected set of such cells that can be well isolated from external circuitry and which do not introduce insertion loss into an RF signal path, exhibit good return loss, and further provides additional advantages when combined with bracketing attenuator circuits. More particularly, embodiments integrate a high-isolation function within a phase shifter circuit by breaking the complimentary nature of the control signals to a phase shifter cell to provide greater control of switch states internal to the phase shifter cell and thus enable a distinct high-isolation state, and by including a switchable shunt termination resistor for use in the high-isolation state. Some embodiments are serially coupled to attenuator circuits to enable synergistic interaction that reduces overall die size and/or increases isolation. One such embodiment positions a high-isolation phase shifter cell in accordance with the present invention between bracketing programmable attenuators.

20 Claims, 7 Drawing Sheets

(56) References Cited

U.S. PATENT DOCUMENTS

2011/0304409 A1 12/2011 Tamura
2017/0230033 A1 8/2017 Shapiro et al.
2019/0074809 A1 3/2019 Shapiro et al.

OTHER PUBLICATIONS

Glenn, Kimberly E., Office Action received from the USPTO dated May 17, 2018 for U.S. Appl. No. 15/018,188, 13 pgs.
Glenn, Kimberly E., Notice of Allowance received from the USPTO dated Sep. 20, 2018 for U.S. Appl. No. 15/018,188, 7 pgs.
Shapiro, et al., Response filed in the USPTO dated Feb. 2, 2018 for U.S. Appl. No. 15/018,188, 11 pgs.
Shapiro, et al., Response filed in the USPTO dated May 21, 2018 for U.S. Appl. No. 15/018,188, 11 pgs.
Glenn, Kimberly E., Office Action received from the USPTO dated Jul. 11, 2019 for U.S. Appl. No. 15/018,188, 13 pgs.
Glenn, Kimberly E., Notice of Allowance received from the USPTO dated Feb. 14, 2020 for U.S. Appl. No. 15/018,188, 8 pgs.
pSEMI Corporation, Response filed in the USPTO dated Nov. 6, 2019 for U.S. Appl. No. 16/177,097, 8 pgs.

Low Pass Filter
(Prior Art)

High Pass Filter
(Prior Art)

INTEGRATED AND COMBINED PHASE SHIFTER AND ISOLATION SWITCH

CROSS-REFERENCE TO RELATED APPLICATIONS—CLAIM OF PRIORITY

This application is a continuation of, and claims the benefit of priority under 35 USC § 120 of, commonly assigned and co-pending prior U.S. application Ser. No. 16/177,097, filed Oct. 31, 2018, entitled "Integrated and Combined Phase Shifter and Isolation Switch", the disclosure of which is incorporated herein by reference in its entirety. Application Ser. No. 16/177,097 is a divisional of, and claims the benefit of priority under 35 USC § 120 of, commonly assigned pending prior U.S. application Ser. No. 15/018,188, filed Feb. 8, 2016, "Integrated and Combined Phase Shifter and Isolation Switch", now U.S. Pat. No. 10,141,910 issued Nov. 27, 2018, the disclosure of which is incorporated herein by reference in its entirety.

BACKGROUND

(1) Technical Field

This invention relates to electronic radio frequency (RF) circuits, and more particularly to RF phase shifter circuits.

(2) Background

Electronic phase shifter circuits are used to change the transmission phase angle of a signal, and are commonly used to phase shift RF signals. RF phase shifter circuits may be used for applications such as in-phase discriminators, beam forming networks, power dividers, linearization of power amplifiers, and phased array antennas, to name a few.

For many applications, it may be useful to serially-connect multiple phase shifter unit cells of the same or different phase shift values. Such phase shifter circuits may be digitally controlled and thus provide a discrete set of phase states that are selected by a binary control word, directly or after decoding. For example, such phase shifter circuits may be binary-coded, thermometer coded, or a hybrid combination of the two types. Some phase shifter circuits may also include a digitally controlled RF signal attenuator circuit that provides a discrete set of attenuation states that are selected by a binary control word, directly or after decoding.

FIG. 1 is a block diagram of a conventional phase shifter unit cell 100. Two ports, P1, P2, either of which may be an input port to the phase shifter cell 100 for an RF signal or an output port for the phase shifter cell 100, are coupled by a low pass filter (LPF) path 102 and a high pass filter (HPF) path 104. In the illustrated example, the LPF path 102 includes an LPF circuit 106, a primary LPF isolation switch 108, and an optional secondary LPF isolation switch 110 (the optional nature is symbolized by the dotted box). A common control signal, A, is coupled to the primary LPF isolation switch 108 and the optional secondary LPF isolation switch 110 (if present), and may be coupled to the LPF circuit 106 (the optional nature of such a coupling is symbolized by a dotted connection line). Similarly, the HPF path 104 includes an HPF circuit 112, a primary HPF isolation switch 114, and an optional secondary HPF isolation switch 116. A common control signal, $\overline{A}$ (i.e., the inverse or complement of the A control signal), is coupled to the primary HPF isolation switch 114 and the optional secondary HPF isolation switch 116 (if present), and may be coupled to the HPF circuit 112.

For small phase shifts, the LPF circuit 106 may be as simple as an inductor and the HPF circuit 112 may be as simple as a capacitor. For medium to large phase shifts, the LPF circuit 106 and the HPF circuit 112 may be more complex. For example, FIG. 2 is a schematic diagram of an LPF circuit 200 having a conventional Pi-type configuration. An inductor L1 provides a series connection between ports LP1, LP2, while bracketing capacitors C1, C2 connect ports LP1 and LP2 to circuit ground through corresponding FET switches M1, M2. In this example, the switches M1, M2 are controlled by the control signal A from FIG. 1, and help provide isolation when the LPF circuit 200 is to be isolated from ports P1 and P2. The operation of a Pi-type low pass filter is well-known in the art.

Similarly, FIG. 3 is a schematic diagram of an HPF circuit 300 having a conventional T-type configuration. Series-connected capacitors C3, C4 provide a series connection between ports HP1, HP2, while an interposed inductor L provides a connection from the junction of capacitors C3 and C4 to circuit ground through a corresponding FET switch M3. In this example, the switch M3 is controlled by the control signal $\overline{A}$ from FIG. 1, and helps provide isolation when the HPF circuit 300 is to be isolated from ports P1 and P2. The operation of a T-type high pass filter is well-known in the art.

Referring to FIG. 1, all of the isolation switches are typically implemented as field effect transistors (FETs) having a "CLOSED" or "ON" state (i.e., low impedance, signal conducting) and an "OPEN" or "OFF" state (i.e., high impedance, signal blocking) between the drain and source terminals, determined by a control signal to the gate of the FET. A conventional driver circuit (not shown) concurrently generates suitable voltages corresponding to the complementary control signals A and $\overline{A}$ for the isolation switch FETs and for the FETs within those embodiments of the LPF circuit 106 and the HPF circuit 112 that include switches (as in FIG. 2 and FIG. 3); such driver circuits are also known as level shifters. In some configurations, a bypass path (not shown) may be included that simply connects ports P1 and P2 through a FET switch while setting the LPF path 102 and the HPF path 104 to an isolation state.

In operation, the control signals A and $\overline{A}$ emanate from the same driver circuit and are complementary, meaning that they flip binary states in unison: when A=1, then $\overline{A}$=0, and when A=0, then $\overline{A}$=1. Accordingly, only one of the LPF path 102 and the HPF path 104 are coupled between ports P1 and P2 at any one time.

In particular, when the LPF path 102 is to be coupled between ports P1 and P2, then A=1 and $\overline{A}$=0. Thus, the primary LPF isolation switch 108 and the optional secondary LPF isolation switch 110 (if present) are ON, as are any FET switches within the LPF circuit 106. Concurrently, the primary HPF isolation switch 114 and the optional secondary HPF isolation switch 116 (if present) are OFF, as are any FET switches within the HPF circuit 112.

Conversely, when the HPF path 104 is to be coupled between ports P1 and P2, then A=0 and $\overline{A}$=1. Thus, the primary HPF isolation switch 114 and the optional secondary HPF isolation switch 116 (if present) are ON, as are any FET switches within the HPF circuit 112. Concurrently, the primary LPF isolation switch 108 and the optional secondary LPF isolation switch 110 (if present) are OFF, as are any FET switches within the LPF circuit 106.

For small phase shifts (e.g., less than about 12°), using a simple inductor for the LPF circuit 106 and a simple capacitor for the HPF circuit 112 provides good return loss (theoretically less than about 20 dB) and consumes little integrated circuit (IC) die area with few components and switches (in general, the optional secondary isolation switches 110, 116 are not needed).

For medium phase shifts (e.g., about 12° to about)90°, the more complex LPF circuit 200 and HPF circuit 300 of FIG. 2 and FIG. 3, respectively, may be necessary to maintain good return loss and achieve targeted phase shift states with realistic component values suitable for IC implementation. However, the optional secondary isolation switches 110, 116 generally would not be needed, thus saving IC die area.

For larger phase shifts (e.g., above about)90°, the more complex LPF circuit 200 and HPF circuit 300 of FIG. 2 and FIG. 3, respectively, are generally necessary to maintain good return loss and achieve targeted phase shift states with realistic component values suitable for IC implementation. In addition, the optional secondary isolation switches 110, 116 generally would be needed to provide adequate isolation.

For a system requiring a high resolution phase shifter, such as for RF domain cancellation or calibration, a high-isolation mode may be desired for a phase shifter unit cell 100 or a connected set of such cells. For example, in some applications, it may be a design criterion for a phase shifter to have a disabled, or all OFF state, so that the output port has 50 dB or more of isolation from the input port. A conventional solution would be to insert a FET switch in series with the input of the phase shifter chain—for example, at node X in FIG. 1—but doing so would introduce added insertion loss. More specifically, in RF circuits, the presence of a FET switch may have significant effects on the rest of the circuit, particularly with respect to termination impedance and isolation levels. Such effects arise because an "ON" (low impedance) FET has a non-zero resistance, $R_{ON}$, and an "OFF" (high impedance) FET behaves as a capacitor with capacitance $C_{OFF}$. Thus, adding a series FET switch to a phase shifter circuit will increase insertion loss due to the ON resistance, $R_{ON}$, of the FET while remaining capacitively coupled to external circuitry—and thus not fully isolated from the RF signal path—due to the capacitance $C_{OFF}$.

Accordingly, there is a need for a phase shifter unit cell or a connected set of such cells that can be well isolated from external circuitry and which does not introduce insertion loss into the RF signal path. The present invention addresses this need and provides additional advantages.

SUMMARY OF THE INVENTION

Embodiments of the present invention provide a phase shifter unit cell or a connected set of such cells that can be well isolated from external circuitry and which do not introduce insertion loss into the RF signal path, exhibit good return loss, and further provides additional advantages when combined with bracketing attenuator circuits.

More particularly, embodiments of the present invention integrate a high-isolation function within a phase shifter circuit that does not introduce added insertion loss and reduces die area compared to a conventional series switch solution. These advantages are accomplished by breaking the complimentary nature of the control signals to a phase shifter cell to provide greater control of switch states internal to the phase shifter cell and thus enable a distinct high-isolation state, and by including a switchable shunt termination resistor for use in the high-isolation state.

More specifically, embodiments of the present invention include multiple independent switch control signals corresponding to two or more switchable elements in a phase shifter circuit, rather than using complimentary control signals to toggle between only a high pass filter state and a low pass filter state.

Some embodiments are serially coupled to attenuator circuits to enable synergistic interaction that reduces overall die size and/or increases isolation. One such embodiment positions a phase shifter cell in accordance with the present invention between bracketing programmable attenuators.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Embodiments of the present invention provide a phase shifter unit cell or a connected set of such cells that can be well isolated from external circuitry, exhibit good return loss, and which do not introduce insertion loss into the RF signal path, and further provides additional advantages when combined with bracketing attenuator circuits.

More particularly, embodiments of the present invention integrate a high-isolation function within a phase shifter circuit that does not introduce added insertion loss and reduces die area compared to a conventional series switch solution. These advantages are accomplished by breaking the complimentary nature of the control signals to a phase shifter cell to provide greater control of switch states internal to the phase shifter cell and thus enable a distinct high-isolation state, and by including a switchable shunt termination resistor for use in the high-isolation state.

More specifically, embodiments of the present invention include multiple independent switch control signals corresponding to two or more switchable elements in a phase shifter circuit, rather than using complimentary control signals to toggle between only a high pass filter state and a low pass filter state.

First Example Embodiment

Figure 1:
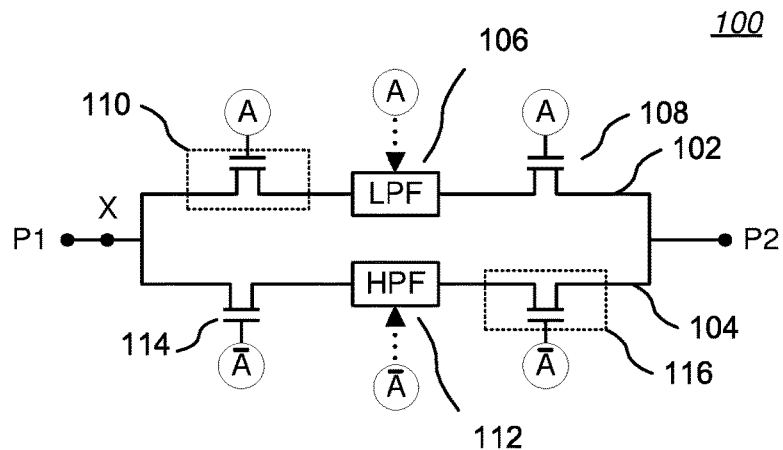
FIG. 1 is a block diagram of a conventional phase shifter unit cell.
Figure 2:
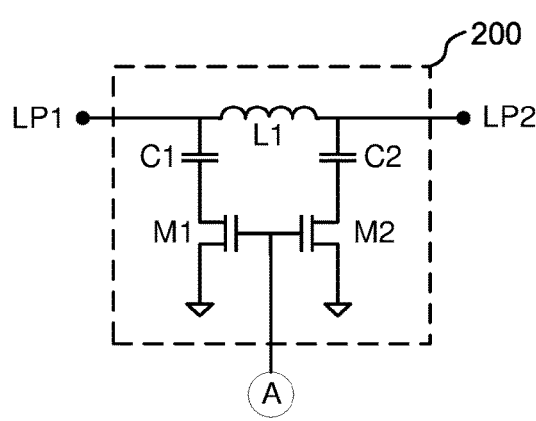
FIG. 2 is a schematic diagram of an LPF circuit having a conventional Pi-type configuration.
Figure 3:
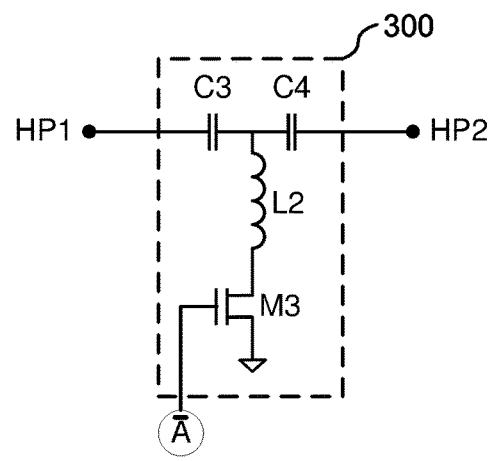
FIG. 3 is a schematic diagram of an HPF circuit having a conventional T-type configuration.
Figure 4:
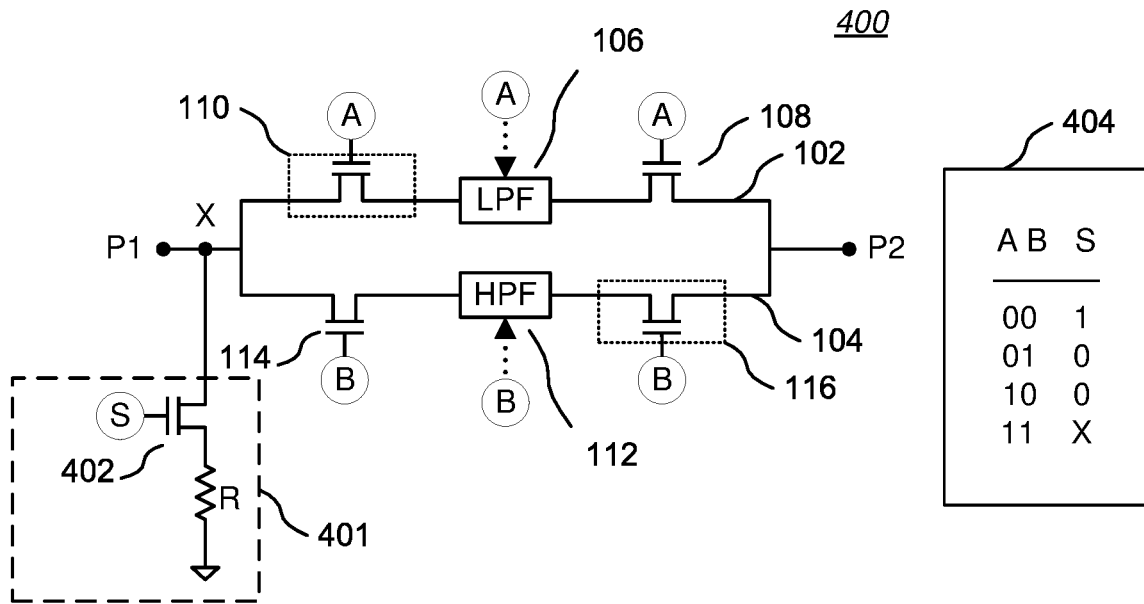
FIG. 4 is a block diagram of a first embodiment of the present invention showing a phase shifter unit cell having independent path selection control signals A, B, and a distinct isolation circuit control signal S.

FIG. 4 is a block diagram of a first embodiment of the present invention showing a phase shifter unit cell 400 having independent path selection control signals A, B, and a distinct isolation circuit control signal S. The components and configuration of the phase shifter cell 400 is similar to the phase shifter unit cell 100 of FIG. 1, but further includes a termination circuit 401 coupled to a node X on the input port (P1 in this example) of the phase shifter unit cell 400.

In the illustrated embodiment, the termination circuit 401 comprises a shunt resistor R serially coupled to a shunt switch 402, shown as a FET (such as a MOSFET). The order of the shunt resistor R and the shunt switch 402 may be reversed. In some embodiments, the shunt resistor R may be a variable resistor to allow tuning the termination circuit 401 to a particular characteristic impedance (typically 50 ohms for an RF circuit). The shunt switch 402 may be implemented as a "stack" of serially connected components (e.g., FETs) to withstand greater voltages.

For the illustrated example, separate driver circuits (not shown) are configured to output independent path selection control signals A, B, and a distinct isolation circuit control signal S. As illustrated, path selection control signal A is coupled to all of the switchable elements of the LPF path 102 (i.e., the primary LPF isolation switch 108, the optional secondary LPF isolation switch 110 if present, and any switchable elements in the LPF circuit 106). Similarly, path selection control signal B is coupled to all of the switchable elements of the HPF path 104 (i.e., the primary HPF isolation switch 114, the optional secondary HPF isolation switch 116 if present, and any switch elements in the HPF circuit 112). Isolation circuit control signal S is coupled to the shunt switch 402 of the termination circuit 401.

While the switchable elements in the example shown in FIG. 4 are illustrated as FETs, the invention is not limited to phase shifters circuits implemented with FETs, and applies to other types of switchable elements, such as bipolar transistors, micro-electromechanical systems (MEMS) switches, etc.

In operation, three modes are generally used in accordance with the truth table 404 shown adjacent to the phase shifter unit cell 400:

LPF mode: Path selection control signal A is set to binary 1 to activate the LPF path 102, while path selection control signal B is set to binary 0 to deactivate the HPF path 104 and isolation circuit control signal S is set to binary 0 to de-couple the shunt resistor R from node X.

HPF mode: Path selection control signal B is set to binary 1 to activate the HPF path 104, while path selection control signal A is set to binary 0 to deactivate the LPF path 102 and isolation circuit control signal S is set to binary 0 to de-couple the shunt resistor R from node X.

Isolation mode: Isolation circuit control signal S is set to binary 1 to couple the shunt resistor R to node X, while path selection control signal A is set to binary 0 to deactivate the LPF path 102 and path selection control signal B is set to binary 0 to deactivate the HPF path 104. Deactivating both the LPF path 102 and the HPF path 104 while shunting node X to ground provides excellent isolation of the phase shifter unit cell 400 (and any phase shifter unit cells further along the RF signal path from the input port) without interposing additional impedance in the RF signal path that would increase insertion loss. Setting isolation circuit control signal S to binary 0 enables a general "phase shifting mode" that allows the LPF mode or the HPF mode to be selected.

As shown in the truth table 404, the state of isolation circuit control signal S may be generated by applying the logical NOR function to the selection control signals A and B (noting that the fourth combination, with A and B both a logical 1, would not generally be used, and thus the state of isolation circuit control signal S is shown as "X", meaning "don't care"). However, in other embodiments, isolation circuit control signal S may be separately controlled independent of path selection control signals A and B to achieve the same results.

FURTHER EXAMPLES

Figures 5A, 5B:
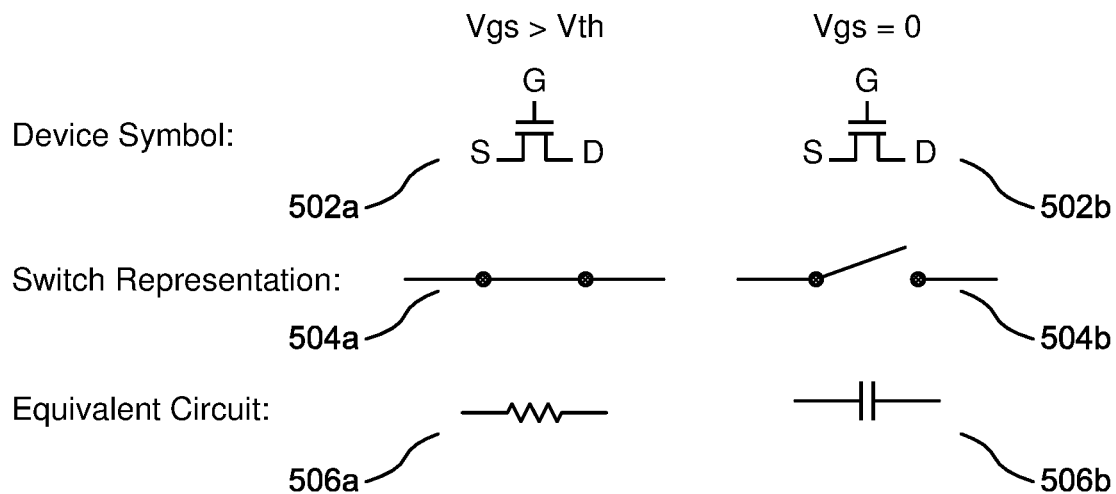
FIG. 5A shows a FET device in an ON or conducting mode (i.e., Vgs>Vth for an enhancement mode N-channel device), along with a closed switch representation and the equivalent circuit (i.e., the $R_{ON}$ resistance of the FET device).
FIG. 5B shows a FET device in an OFF or blocking mode (i.e., Vgs=0 for an enhancement mode N-channel device), along with an open switch representation and the equivalent circuit (i.e., the $C_{OFF}$ capacitance of the FET device).

Other configurations of the invention may be useful for a variety of applications. To simplify the figures showing such configurations, equivalent symbols are used in some of the following illustrations. More specifically, FIG. 5A shows a FET device 502a in an ON or conducting mode (i.e., Vgs>Vth for an enhancement mode N-channel device), along with a closed switch representation 504a and the equivalent circuit 506a (i.e., the $R_{ON}$ resistance of the FET device 502a). Similarly, FIG. 5B shows a FET device 502b in an OFF or blocking mode (i.e., Vgs=0 for an enhancement mode N-channel device), along with an open switch representation 504b and the equivalent circuit 506b (i.e., the $C_{OFF}$ capacitance of the FET device 502b). However, there are multiple technologies and means for implementing the illustrated switches. For example, focusing on FET technology alone, embodiments of the invention may be implemented with NMOS, PMOS, and/or CMOS transistor switches, and enhancement mode or depletion mode transistor devices. Further, such switches are not limited to devices having only the two states of ON and OFF. In addition, as noted above, the inventive concepts apply to other types of switchable elements, such as bipolar transistors, micro-electromechanical systems MEMS) switches, etc. Accordingly, how such switches are shown implemented in the illustrated embodiments should not detract from the spirit of the invention.

Figure 6:
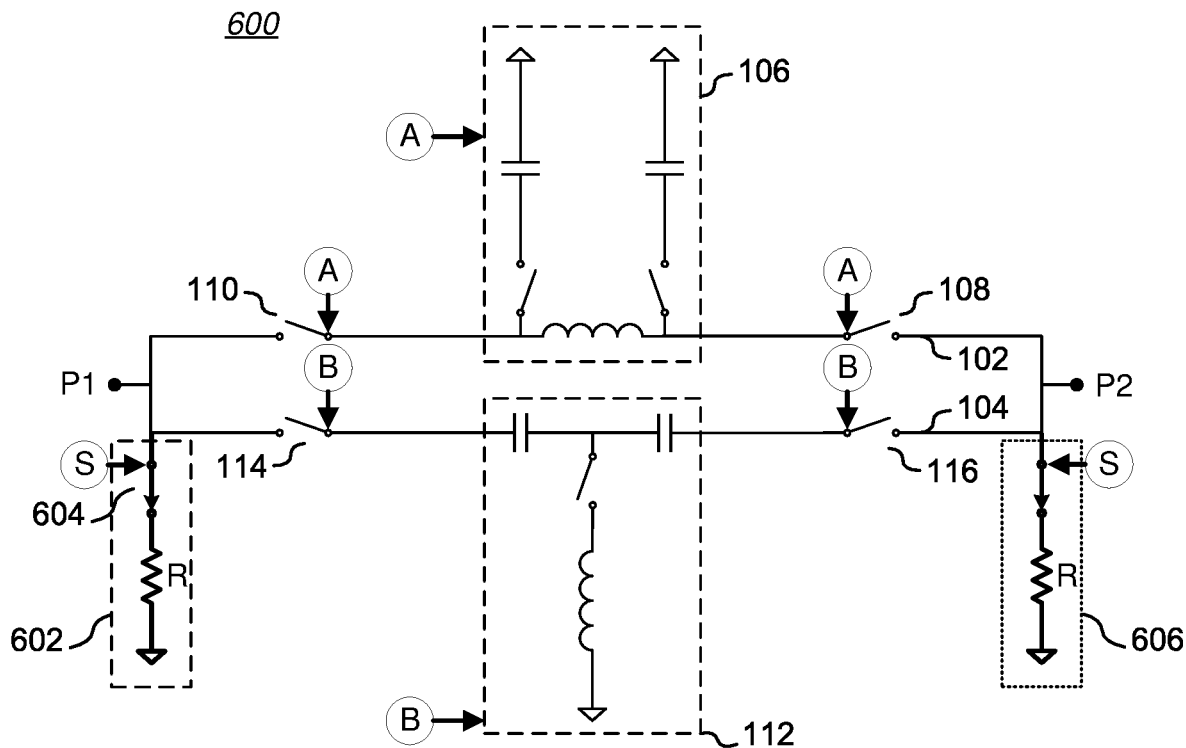
FIG. 6 is an equivalent circuit diagram of a second phase shifter unit cell embodiment in accordance with the present invention, with switches configured for the isolation mode.

FIG. 6 is an equivalent circuit diagram of a second phase shifter unit cell 600 embodiment in accordance with the present invention, with switches configured for the isolation mode. Similar in most respects to the embodiment shown in FIG. 4, the second phase shifter unit cell 600 shows a Pi-type LPF circuit 106 having internal switches controlled by path selection control signal A, and a T-type HPF circuit 112 having an internal switch controlled by path selection control signal B. For the isolation mode, path selection control signals A and B are both set to binary 0, thus opening all switches to which those control signals are connected. For the LPF mode, path selection control signal A is set to binary 1 and path selection control signal B is set to binary 0, and for the HPF mode, those states are reversed.

A first resistor/shunt switch element 602 comprising a shunt switch 604 serially connected to a resistor R is coupled as a switchable termination circuit between the input port (P1 in this example) and circuit ground. The shunt switch 604 is controlled by isolation circuit control signal S and shunts the input port (P1 in this example) of the second phase shifter unit cell 600 to circuit ground through the resistor R when S=1. When S=0, the resistor R is disconnected from the port and the shunt switch 604 if effectively a capacitor. Accordingly, the resistor/shunt switch element 602 imposes no significant load on the signal path from P1 to P2 and thus does not add to the insertion loss of the phase shifter unit cell 600. For even further isolation at the other port, P2, an optional second resistor/shunt switch element 606 also controlled by isolation circuit control signal S may be coupled as a switchable termination circuit between the output port (P2 in this example) and circuit ground. In the illustrated example, the first resistor/shunt switch element 602 and the second resistor/shunt switch element 606 may be considered to be in an "outside" configuration, utilizing no other components of the second phase shifter unit cell 600. Note also that that the resistor/shunt switch elements 602, 606 need not be electrically identical. For example, the sizes of their internal shunt switch FETs may differ to provide a more uniform impedance level for the corresponding ports port P1, P2, taking into account such factors as asymmetric amounts of parasitic elements (e.g., capacitances and inductances) associated with the circuitry and layout affecting each port. Accordingly, it may be useful to size the internal shunt switch FETs so as to offset such asymmetry and provide a more uniform signal path impedance level.

As in the first embodiment of a phase shifter unit cell 400 shown in FIG. 4, isolation circuit control signal S for the embodiment of FIG. 6 may be generated according to truth table 404 (see FIG. 4) or independently provided as a control signal from a source external to the illustrated circuit.

Figure 7:
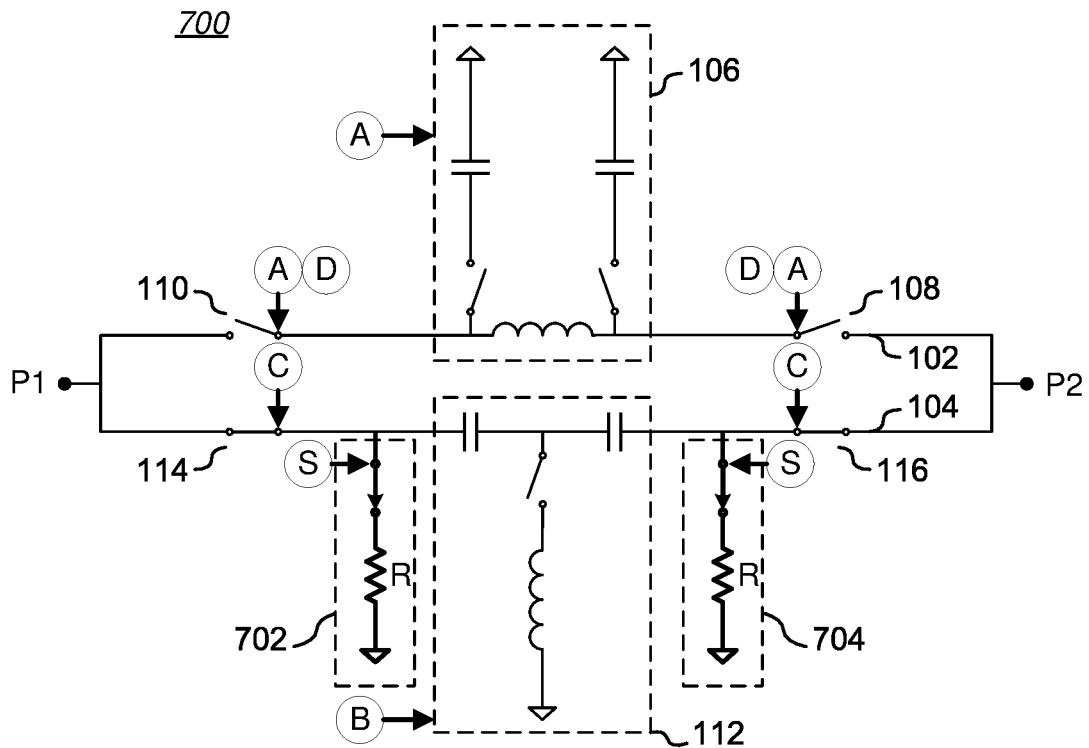
FIG. 7 is an equivalent circuit diagram of a third phase shifter unit cell embodiment in accordance with the present invention, with switches configured for the isolation mode.

FIG. 7 is an equivalent circuit diagram of a third phase shifter unit cell 700 embodiment in accordance with the present invention, with switches configured for the isolation mode. As in FIG. 6, the third phase shifter unit cell 700 shows a Pi-type LPF circuit 106 having internal switches controlled by path selection control signal A, and a T-type HPF circuit 112 having an internal switch controlled by path selection control signal B. For the isolation mode, path selection control signals A and B are both set to binary 0, thus opening all switches to which those control signals are connected.

In contrast to FIG. 6, the HPF path 104 has yet another independent path selection control signal, C, which is set to binary 1 in the illustrated isolation mode example, thus closing isolation switches 114 and 116. One or more resistor/shunt switch elements 702, 704 controlled by isolation circuit control signal S are connected to the HPF path 104 between an associated isolation switch 114, 116 and the HPF circuit 112. As illustrated, S=1, and thus if resistor/shunt switch element 702 is present, any signal present at port P1 would be shunted to ground through isolation switch 114 and resistor/shunt switch element 702. Similarly, if resistor/shunt switch element 704 is present, any signal present at port P2 would be shunted to ground through isolation switch 116 and resistor/shunt switch element 704. Both resistor/shunt switch elements 702, 704 may be implemented for increased isolation at both ports P1 and P2. In the illustrated example, the resistor/shunt switch elements 702, 704 may be considered to be in an "inside" configuration, since they utilize the isolation switches 114 and 116 to complete a termination path to ground when in the isolation mode.

A first variant configuration would independently control isolation switches 108 and 110 with a path selection control signal D and couple corresponding resistor/shunt switch elements to the LPF path 102 between the isolation switches 108, 110 and the LPF circuit 106 (i.e., essentially mirroring the configuration shown in FIG. 7, but using the LPF path 102 rather than the HPF path 104 for isolation). A second variant configuration would use both the illustrated circuit of FIG. 7 and the first variant configuration just described, placing resistor/shunt switch elements (not shown) on both the LPF path 102 and the HPF path 104 and closing isolation switches 108, 110, 114, and 116 in the isolation mode with path selection control signals C and D. In either case, each resistor/shunt switch element 702, 704 is controlled by isolation circuit control signal S.

In any variant of the third phase shifter unit cell 700 of FIG. 7, the LPF mode and the HPF mode are enabled by setting isolation circuit control signal S=0 for each resistor/shunt switch element, and having path selection control signal C track path selection control signal B (i.e., C=B) and path selection control signal D track path selection control signal A (i.e., D=A). However, as described above, in the isolation mode, path selection control signals C and D are controlled independently of path selection control signals A and B.

One advantage of the configuration shown in FIG. 7 and its variants is that the use of one or more of the existing isolation switches 108, 110, 114, and 116 in series combination with a corresponding resistor/shunt switch element allows the shunt resistor R to be smaller (since the $R_{ON}$ resistance of the isolation switches withstands some signal power), or provides higher power handling capability if a "normal" sized resistor is used for R (since $R_{ON}$ is added to R).

Aspects of both the "outside" configuration of FIG. 6 and the "inside" configuration of FIG. 7 can be combined. For example, an "outside" configuration can be used for coupling a resistor/shunt switch element to port P1, while an "inside" configuration can be used for coupling a resistor/shunt switch element to port P2, with suitable independent path selection control signals and an isolation circuit control signal S. Thus, referring to FIG. 7, resistor/shunt switch element 702 may be shifted to the port P1 side of isolation switch 114, in which case path selection control signal B would be used to control isolation switch 114, as in FIG. 6.

Figure 8:
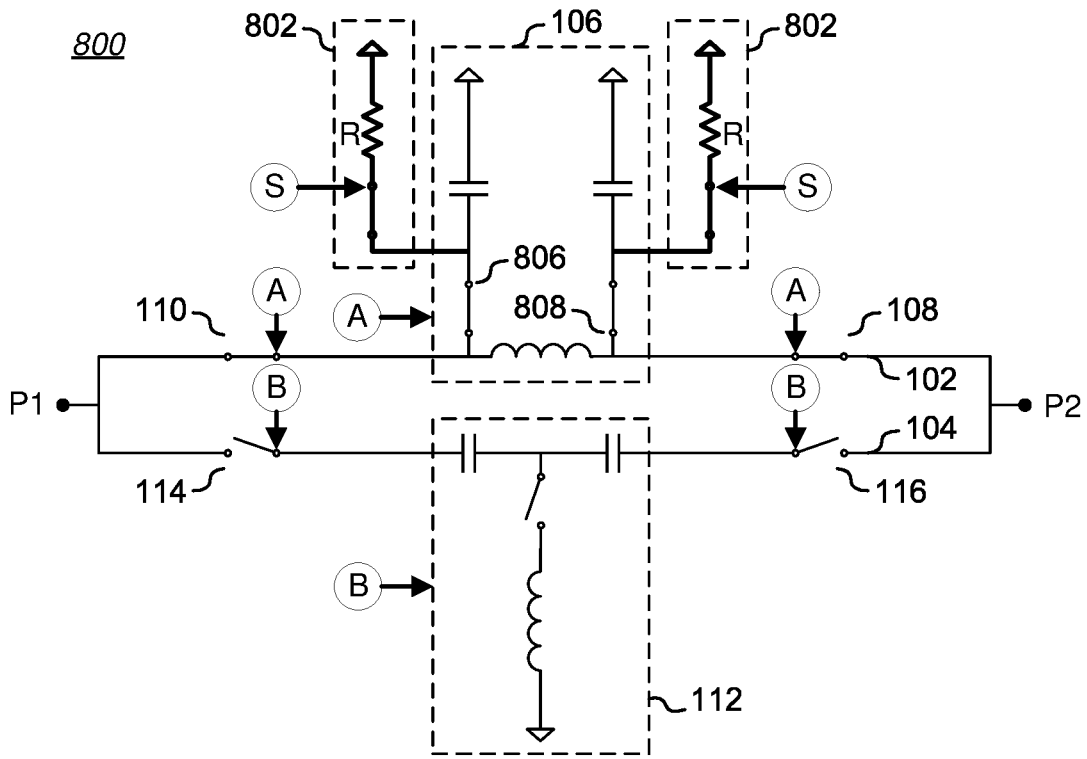
FIG. 8 is an equivalent circuit diagram of a fourth phase shifter unit cell embodiment in accordance with the present invention, with switches configured for the isolation mode.

FIG. 8 is an equivalent circuit diagram of a fourth phase shifter unit cell 800 embodiment in accordance with the present invention, with switches configured for the isolation mode. As in FIG. 6, the fourth phase shifter unit cell 800 shows a Pi-type LPF circuit 106 having internal switches controlled by path selection control signal A, and a T-type HPF circuit 112 having an internal switch controlled by path selection control signal B. As illustrated, path selection control signal B is set to binary 0, thus opening all switches to which that control signal is connected, while independent path selection control signal A is set to binary 1, thus closing all switches to which that control signal is connected. One or more resistor/shunt switch elements 802 are coupled as shown between a corresponding internal switch 806, 808 of the Pi-type LPF circuit 106 and circuit ground. Each resistor/shunt switch element 802 is controlled by isolation circuit control signal S.

One advantage of the configuration shown in FIG. 8 is that the use of one or more of the existing isolation switches 108, 110 in series with an internal switch 806, 808 of the Pi-type LPF circuit 106 allows the shunt resistor R of the corresponding series-connected resistor/shunt switch element 802 to be even smaller than the circuit configuration of FIG. 7 (since the $R_{ON}$ of the isolation switches and the $R_{ON}$ of the internal switches withstands more signal power than the single series isolation switch configuration of FIG. 7), or provides higher power handling capability if a "normal" sized resistor is used for R (since approximately $2 \times R_{ON}$ is added to R).

Figure 9:
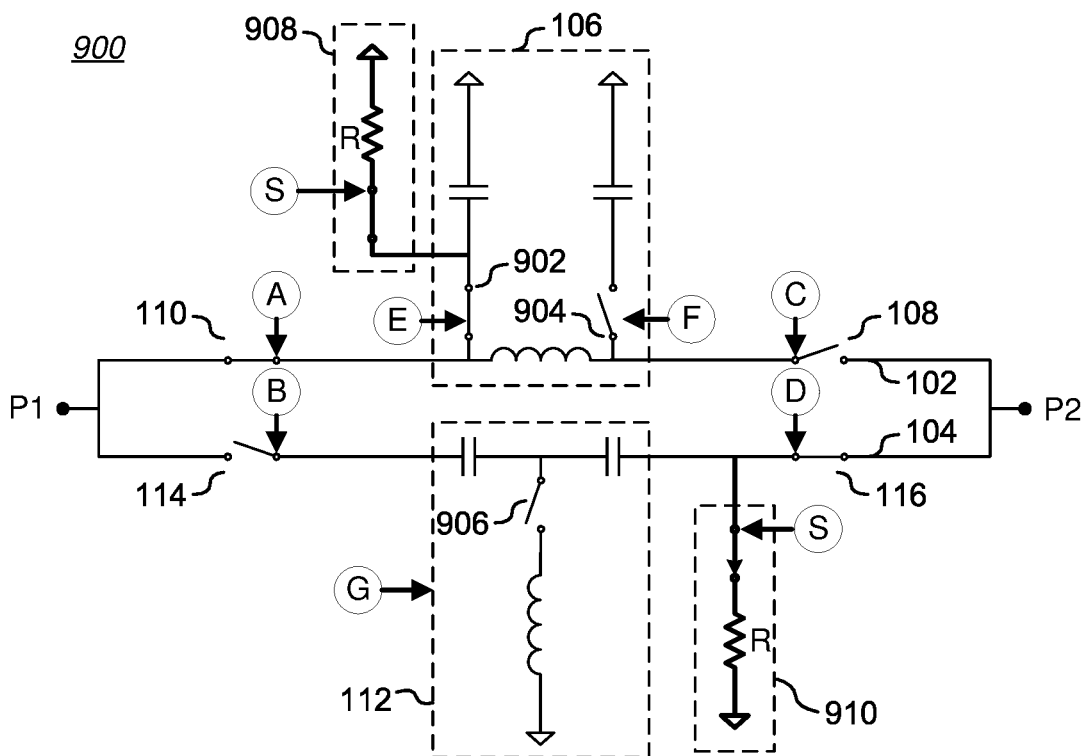
FIG. 9 is an equivalent circuit diagram of a fifth phase shifter unit cell embodiment in accordance with the present invention, with switches configured for the isolation mode.

FIG. 9 is an equivalent circuit diagram of a fifth phase shifter unit cell 900 embodiment in accordance with the present invention, with switches configured for the isolation mode. As in FIG. 6, the fifth phase shifter unit cell 900 shows a Pi-type LPF circuit 106 having internal switches 902, 904, a T-type HPF circuit 112 having an internal switch 906, an LPF path 102 having isolation switches 108, 110, and an HPF path 104 having isolation switches 114, 116. Also included are two resistor/shunt switch elements 908, 910 controlled by the isolation circuit control signal S. Resistor/shunt switch element 908 is configured similar to resistor/shunt switch element 802 of FIG. 8, while resistor/shunt switch element 910 is configured similar to resistor/shunt switch element 704 of FIG. 7.

In the example illustrated in FIG. 9, each switch is independently controlled (although in some cases, the state of one switch control signal may exactly track the state of another switch control signal, thus allowing some simplification of the control logic). For the circuit configuration illustrated in FIG. 9, the switch control states for various operational modes are as shown in TABLE 1.

TABLE 1

| Control Signal | Control State by Mode | | |
|---|---|---|---|
| | LPF Mode | HPF Mode | Isolation Mode |
| A | 1 | 0 | 1 |
| B | 0 | 1 | 0 |
| C | 1 | 0 | 0 |
| D | 0 | 1 | 1 |
| E | 1 | 0 | 1 |
| F | 1 | 0 | 0 |
| G | 0 | 1 | 0 |
| S | 0 | 0 | 1 |

Note that control signals A and E track each other, as do control signals B and G and control signals C and F. Accordingly, TABLE 1 can be simplified as shown in TABLE 2.

TABLE 2

| Control Signal | Control State by Mode | | |
|---|---|---|---|
| | LPF Mode | HPF Mode | Isolation Mode |
| A, E | 1 | 0 | 1 |
| B, G | 0 | 1 | 0 |
| C, F | 1 | 0 | 0 |
| D | 0 | 1 | 1 |
| S | 0 | 0 | 1 |

Figure 10:
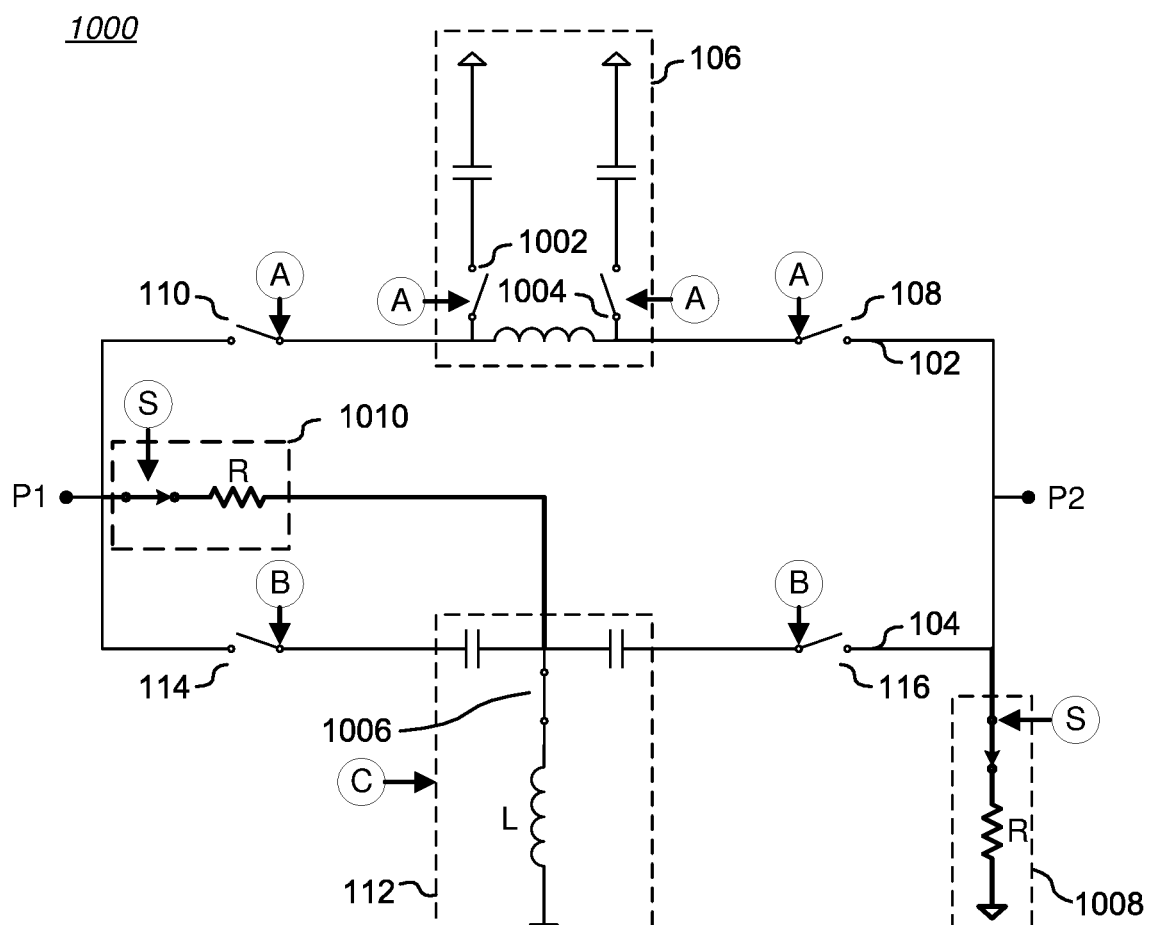
FIG. 10 is an equivalent circuit diagram of a sixth phase shifter unit cell embodiment in accordance with the present invention, with switches configured for the isolation mode.

FIG. 10 is an equivalent circuit diagram of a sixth phase shifter unit cell 1000 embodiment in accordance with the present invention, with switches configured for the isolation mode. As in FIG. 6, the fifth phase shifter unit cell 900 shows a Pi-type LPF circuit 106 having internal switches 1002, 1004, a T-type HPF circuit 112 having an internal switch 1006, an LPF path 102 having isolation switches 108, 110, and an HPF path 104 having isolation switches 114, 116. Also included are two resistor/shunt switch elements 1008, 1010 controlled by the isolation circuit control signal S. Resistor/shunt switch element 1008 is configured similar to resistor/shunt switch element 604 of FIG. 6. However, resistor/shunt switch element 1010 is serially coupled between port P1 and circuit ground through the internal switch 1006 and inductor L of the T-type HPF circuit 112, thus providing a "series" shunt path that does not impose appreciable insertion loss when in the HPF or LPF modes at sufficiently low RF frequencies, yet provides a termination to ground when in the isolation mode (at higher RF frequencies, the frequency dependent impedance of the inductor L in series with the resistor R of the resistor/shunt switch element 1010 when the phase shifter unit cell 1000 is in the isolation mode may need to be taken into account during design).

For the circuit configuration illustrated in FIG. 10, the switch control states for various operational modes are as shown in TABLE 3.

TABLE 3

| Control Signal | Control State by Mode | | |
|---|---|---|---|
| | LPF Mode | HPF Mode | Isolation Mode |
| A | 1 | 0 | 0 |
| B | 0 | 1 | 0 |
| C | 0 | 1 | 1 |
| S | 0 | 0 | 1 |

As the phase shifter unit cell examples shown in FIGS. 4 and 6-10 illustrate, the concepts of the present invention can be implemented in a wide variety of embodiments, which generally include a distinct isolation circuit control signal for controlling at least one termination circuit path operationally coupled between a corresponding port and circuit ground, and at least two independently selectable path selection control signals for controlling at least two corresponding switches within separate phase shift signal paths. Such phase shifter unit cells thus can be well isolated from external circuitry without introducing any significant insertion loss into the RF signal path but still exhibiting good return loss.

Further, the invention extends to low-insertion loss isolation of phase shifter circuits having more than the two signal paths (LPF and HPF), such as phase shifters utilizing multi-state phase shifters of the type taught in U.S. patent application Ser. No. 15/017,433, entitled "Low Loss Multi-State Phase Shifter", filed Feb. 5, 2016, and assigned to the assignee of the present invention, the contents of which are hereby incorporated by reference. In such a case, at least one termination circuit path would be operationally coupled between a corresponding port and circuit ground and controlled by a distinct isolation circuit control signal. In an isolation mode, each signal path is either taken out of circuit by a corresponding path selection control signal, or serially connected (at least in part) with a termination circuit path. In operational phase shift modes, the termination circuit path is taken out of circuit so as to present little or no load on any RF signal path.

If several phase shifter unit cells are serially connected so as to provide a wider range of selectable phase shifts, each phase shifter unit cell may include a termination circuit path controlled by the isolation circuit control signal. Alternatively, such a termination circuit path may be included only in one or both of the end-most phase shifter unit cells in the series, thereby saving IC die area.

For many applications, it may be useful to serially-connect multiple phase shifter unit cells of the same or different phase shift values. Such phase shifter circuits may be digitally controlled and thus provide a discrete set of phase states that are selected by a binary control word, directly or after decoding. For example, such phase shifter circuits may be binary-coded, thermometer coded, or a hybrid combination of the two types.

Phase Shifter and Attenuator Combinations

Another aspect of the invention includes serially connecting one or more digitally selectable phase shifter unit cells having at least one termination circuit path as described above to one or more digitally selectable RF signal attenuator circuits that provides a discrete set of attenuation states that are selected by a binary control word, directly or after decoding. Such attenuation/phase shifter circuit configurations enable synergistic interaction that reduces overall die size and/or increases isolation.

Figure 11:
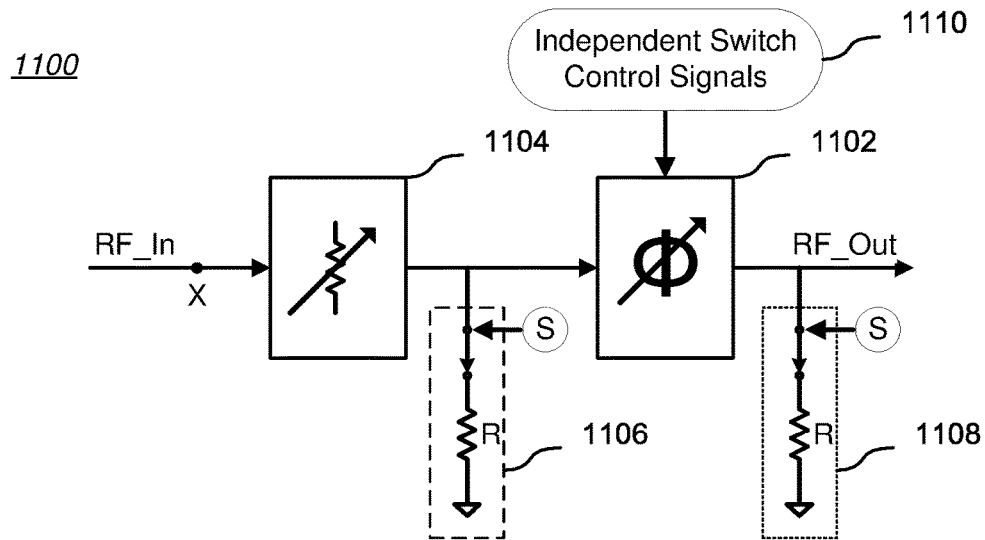
FIG. 11 is a block diagram of a variable phase shifter serially connected to a variable attenuator.

For example, FIG. 11 is a block diagram 1100 of a variable phase shifter 1102 serially connected to a variable attenuator 1104. In the illustrated example, the variable attenuator 1104 includes an RF_In port and the variable phase shifter 1102 includes an RF_Out port. The variable phase shifter 1102 may comprise one or more digitally selectable phase shifter unit cells of the types described above, and the variable attenuator 1104 may comprise one or more digitally selectable attenuator unit cells. Examples of variable attenuators 1104 are disclosed in U.S. patent application Ser. No. 14/084,439, entitled "*Segmented Attenuator with Glitch Reduction*", filed Nov. 19, 2013, and in U.S. patent application Ser. No. 14/878,750, entitled "*Improved Multi-State Attenuator*", filed Oct. 8, 2015, both of which are assigned to the assignee of the present invention, the contents of which are hereby incorporated by reference. Another input to the variable phase shifter 1102 is a set of independent switch control signals 1110 that provide normal operational control of the component digitally selectable phase shifter unit cells, as described above.

FIG. 11 shows the inclusion of a first termination circuit 1106 comprising a resistor/shunt switch element, and an optional second termination circuit 1108 comprising a resistor/shunt switch element, both controlled by an isolation circuit control signal S; as illustrated, the first termination circuit 1106 and the optional second termination circuit 1108 are in the isolation mode. While the first termination circuit 1106 could be coupled to the RF signal path before the variable attenuator 1104 (e.g., at node X), it is more advantageously positioned between the variable phase shifter 1102 and the variable attenuator 1104. By placing the first termination circuit 1106 on the RF signal path with the variable attenuator 1104 interposed with respect to the RF_In port, the variable attenuator 1104 can reduce the power handling requirement of the first termination circuit 1106 in the isolation mode, since some signal power is absorbed within the variable attenuator 1104. Such a configuration reduces the IC die area required for the resistor and switch stack of the termination circuit 1106. Further, in the isolation mode, the variable attenuator 1104 can be programmatically set to its maximum attenuation value to further improve the isolation of the RF_Out port from the RF_In port. The optional second termination circuit 1108 is coupled to the other port (here, RF_Out) of the variable phase shifter 1102 to still further improve the isolation of the RF_Out port from the RF_In port.

Figure 12:
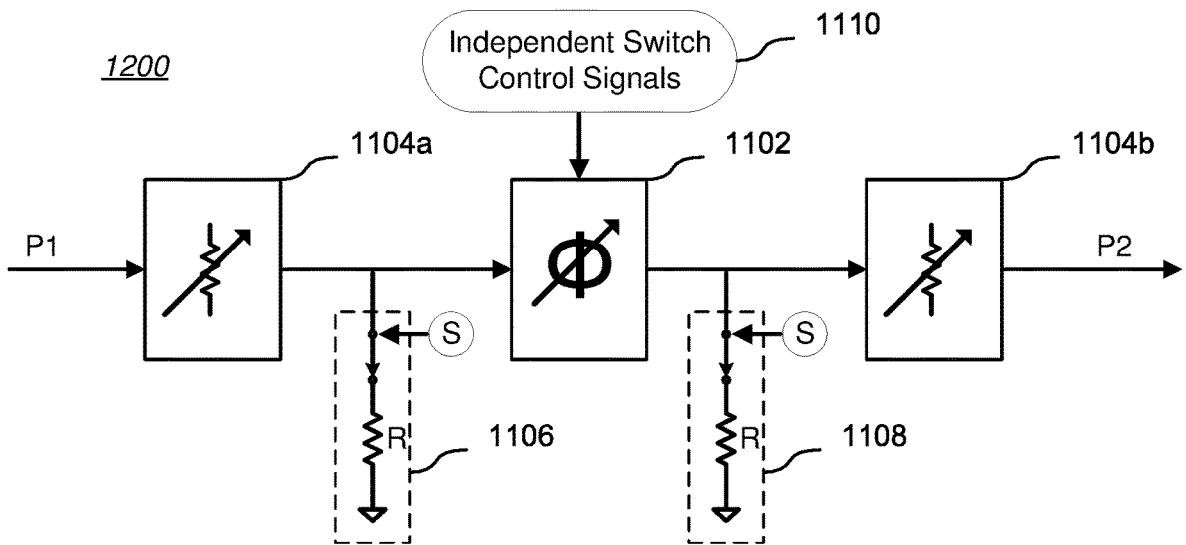
FIG. 12 is a block diagram of a variable phase shifter in accordance with the present invention configured between bracketing serially connected variable attenuators.

The circuit illustrated in FIG. 11 is asymmetric, in that the variable attenuator 1104 only "protects" the first termination circuit 1106 from applied signal power in the isolation mode if interposed between the first termination circuit 1106 and the RF_In port. FIG. 12 is a block diagram 1200 of a variable phase shifter 1102 in accordance with the present invention configured between bracketing serially connected variable attenuators 1104a, 1104b. First and second termination circuits 1106, 1108 are connected to the signal path from port P1 to port P2 and are both controlled by an isolation circuit control signal S; as illustrated, the first and second termination circuits 1106, 1108 are in the isolation mode. The variable attenuators 1104a, 1104b may have the same range of attenuation as the single variable attenuator 1104 of FIG. 11, or each may have a lesser range of attenuation as the single variable attenuator 1104 of FIG. 11 (e.g., one-half). Another input to the variable phase shifter 1102 is a set of independent switch control signals 1110 that provide normal operational control of the component digitally selectable phase shifter unit cells, as described above.

An advantage of the configuration shown in FIG. 12 is that each termination circuit 1106, 1108 is "protected" from the input power of any signal applied to port P1 or to port P2 by an intervening variable attenuator 1104a, 1104b.

Figure 13:
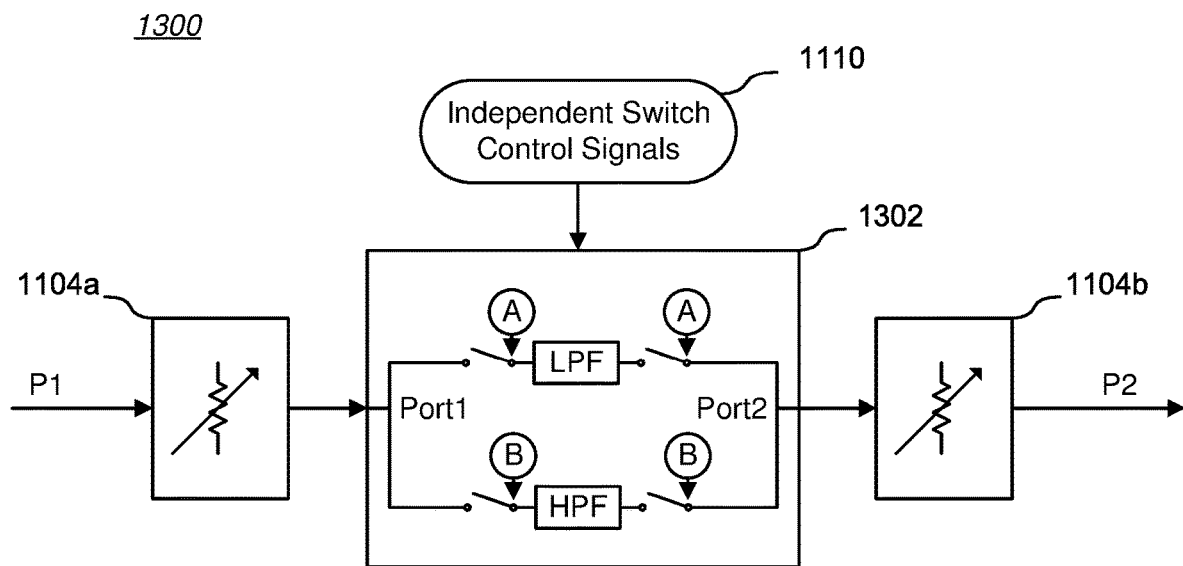
FIG. 13 is a block diagram of a variant of the embodiment shown in FIG. 12 in which a variable phase shifter in accordance with the present invention is configured between bracketing serially connected variable attenuators.

In some applications, the input return loss may be acceptable without requiring independently controlled termination circuits 1106, 1108 for the embodiments shown in FIG. 11 and FIG. 12, so long as there are independent switch control signals 1110 such that the various switches within the variable phase shifter 1102 can be set to a state that provides for isolation. For example, FIG. 13 is a block diagram 1300 of a variant of the embodiment shown in FIG. 12 in which a variable phase shifter 1302 in accordance with the present invention is configured between bracketing serially connected variable attenuators 1104a, 1104b. As in the embodiments of FIG. 11 and FIG. 12, the variable phase shifter 1302 may comprise one or more digitally selectable phase shifter unit cells of the types described above, and the variable attenuators 1104a, 1104b may comprise one or more digitally selectable attenuator unit cells. The variable phase shifter 1302 and the variable attenuators 1104a, 1104b may be binary-coded, thermometer coded, or a hybrid combination of the two types.

An input to the variable phase shifter 1302 is a set of independent switch control signals 1110 that provide normal operational control of the component digitally selectable phase shifter unit cells, as described above; in the illustrated example, such switch control signals include at least independent "A" and "B" signals.

The circuit shown in FIG. 13 is similar to a combination of the circuit shown in FIG. 4 (for the variable phase shifter 1302) and the circuit shown in FIG. 12 (for the combination of variable attenuators 1104a, 1104b and a variable phase shifter). However, when an isolation mode is required, the "A" and "B" signals are both set to a binary 0, thus opening respective switches in both the LPF signal path and the HPF signal path between Port 1 and Port2 and providing a reasonable degree of isolation (in contrast, in a conventional phase shifter, the switches in the LPF signal path and the HPF signal path cannot all be opened concurrently). For even more isolation, the variable attenuators 1104a, 1104b can be programmatically set to their respective maximum attenuation values to further improve the isolation of the P1 port from the P2 port. Because the switch control signals 1110 are independent and thus enable concurrently isolating the signal paths within the variable phase shifter 1302, termination circuits 1106, 1108 (as in FIG. 11 and FIG. 12) are not required if the measured input return loss is acceptable for particular applications.

Notably, the external return loss would be about twice the maximum attenuation value of either of the attenuators 1104a, 1104b (depending on the direction of signal propagation) if loaded with a high impedance by setting the variable phase shifter 1302 to the isolation (open circuit) mode. That is, an open-ended attenuator can provide two times its attenuation value ("X") as the return loss. Thus, an input signal is attenuated by X amount, reflected by the open circuit, and then attenuated by another X amount; X+X=2X, which is the definition of "return loss." This is effectively like a resistive load, from the point of view of an external signal. Further, omitting the independently controlled termination circuits may reduce parasitic loading of the signal path in normal operation and improve performance. As similar result may pertain to the circuit configurations shown in FIG. 11 and FIG. 12.

Methods

Another aspect of the invention includes a method for shifting the phase of an applied signal, including: providing at least two phase shift signal paths, each coupled to first and second ports, for providing a phase shift to a signal applied to at least one of the first and second ports and responsive to a corresponding independent path selection control signal for selectively independently enabling communication of the applied signal from the first port to the second port through the corresponding phase shift signal path when not in an isolation mode, and for disabling communication of the applied signal from the first port to the second port through the corresponding phase shift signal path when in the isolation mode; and providing at least one selectable termination circuit, each operatively coupled to a corresponding one of the first or second ports, and responsive to a distinct isolation circuit control signal for isolating the first port from the second port in the isolation mode.

Yet another aspect of the invention includes a method for shifting the phase of an applied signal, including: providing at least two phase shift signal paths, each for providing a phase shift to a signal applied to at least one of the first and second ports; coupling at least two independent path selection control signals to a corresponding phase shift signal path; coupling a selectable termination circuit to a corresponding one of the first or second ports; selectively enabling each selectable termination circuit to isolate the first port from the second port in an isolation mode; selectively disabling each selectable termination circuit when not in an isolation mode; selectively independently enabling communication of the applied signal from the first port to the second port through the corresponding phase shift signal path when not in the isolation mode; and disabling communication of the applied signal from the first port to the second port through the corresponding phase shift signal path when in the isolation mode.

Still another aspect of the invention includes a method for shifting the phase of an applied radio frequency signal, including: providing at least two phase shift signal paths, each including at least one phase shifter element serially coupled through at least one isolation switch to first and second ports, for providing a selectable degree of phase shift to a radio frequency signal applied to at least one of the first and second ports; providing at least two independent path selection control signals, each coupled to a corresponding phase shift signal path, for selectively coupling the corresponding phase shift signal path to the first and second ports; providing at least one selectable termination circuit, each coupled between circuit ground and a corresponding one of the first or second ports; selectively switching the at least one termination circuit with a distinct isolation circuit control signal to an isolation mode to operationally couple the corresponding one of the first or second ports to circuit ground, or to a phase shifting mode to de-couple the corresponding one of the first or second ports from circuit ground; and in the isolation mode, setting the at least two independent path selection control signals to states that effect isolation of the corresponding phase shift signal path from the first and second ports.

Other aspects of such methods include deriving the distinct isolation circuit control signal from a logical combination of the independent path selection control signals, and providing embodiments of and connections for the phase shift signal paths and termination circuits in accordance with the teachings above.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A digitally-controlled multi-path phase shifter, including:
   (a) a plurality of phase shift signal paths, each phase shift signal path coupled at a first end to a first port and at a second end to a second port, configured to provide a phase shift to a signal applied to at least one of the first port and the second port, and responsive to a corresponding independent path selection control signal to selectively independently enable communication of the applied signal between the first port and the second port through the corresponding phase shift signal path when not in an isolation mode, and disable communication of the applied signal between the first port and the second port through the corresponding phase shift signal path when in the isolation mode; and
   (b) at least one selectable termination circuit, each operatively coupled to a corresponding one of the first port or the second port, and responsive to a distinct isolation circuit control signal to isolate the first port and the second port from each other in the isolation mode.

2. The phase shifter of claim 1, wherein the at least one selectable termination circuit includes a first selectable termination circuit coupled between circuit ground and the first port, and a second selectable termination circuit coupled between circuit ground and the second port.

3. The phase shifter of claim 1, wherein at least one phase shift signal path of the plurality of phase shift signal paths includes at least one isolation switch serially coupled to one of the first port or the second port, and at least one phase shifter element serially coupled to the at least one isolation switch.

4. The phase shifter of claim 3, wherein at least one selectable termination circuit of the at least one selectable termination circuit is coupled between circuit ground and a corresponding one of the first port or the second port through at least one corresponding isolation switch.

5. The phase shifter of claim 3, wherein at least one selectable termination circuit of the at least one selectable termination circuit is coupled between circuit ground and a corresponding one of the first port or the second port through a corresponding phase shifter element.

6. The phase shifter of claim 1, wherein the applied signal is a radio frequency signal.

7. The phase shifter of claim 1, wherein the distinct isolation circuit control signal is derived from a logical combination of the independent path selection control signals.

8. A digitally-controlled multi-path phase shifter, including:
   (a) a plurality of phase shift signal paths, each phase shift signal path coupled at a first end to a first port and at a second end to a second port, and configured to provide a phase shift to a signal applied to at least one of the first port and the second port;
   (b) at least one selectable termination circuit, each operatively coupled to a corresponding one of the first port or the second port, and responsive to a distinct isolation circuit control signal to isolate the first port and the second port from each other in an isolation mode; and
   (c) a plurality of independent path selection control signals, each independent path selection control signal coupled to a corresponding one of the plurality of phase shift signal paths, each independent path selection control signal selectively independently enabling communication of the applied signal between the first port and the second port through the corresponding phase shift signal path when not in the isolation mode, and each independent path selection control signal disabling communication of the applied signal between the first port and the second port through the corresponding phase shift signal path when in the isolation mode.

9. The phase shifter of claim 8, wherein the at least one selectable termination circuit includes a first selectable termination circuit coupled between circuit ground and the first port, and a second selectable termination circuit coupled between circuit ground and the second port.

10. The phase shifter of claim 8, wherein at least one phase shift signal path of the plurality of phase shift signal paths includes at least one isolation switch serially coupled to one of the first port or the second port, and at least one phase shifter element serially coupled to the at least one isolation switch.

11. The phase shifter of claim 10, wherein at least one selectable termination circuit of the at least one selectable termination circuit is coupled between circuit ground and a corresponding one of the first port or the second port through at least one isolation switch.

12. The phase shifter of claim 10, wherein at least one selectable termination circuit of the at least one selectable termination circuit is coupled between circuit ground and a corresponding one of the first or second ports through a corresponding phase shifter element.

13. The phase shifter of claim 8, wherein the applied signal is a radio frequency signal.

14. The phase shifter of claim 8, wherein the distinct isolation circuit control signal is derived from a logical combination of the independent path selection control signals.

15. A phase shifter including at least one phase shifter unit cell, the at least one phase shifter unit cell including:
   (a) a plurality of phase shift signal paths, each phase shift signal path including at least one phase shifter element serially coupled through at least one isolation switch to a first port and a second port, and configured to provide a selectable degree of phase shift to a radio frequency signal applied to at least one of the first port or the second port;
   (b) a plurality of independent path selection control signals, each independent path selection control signal coupled to a corresponding one of the plurality of phase shift signal paths, and configured to selectively couple the corresponding phase shift signal path to the first port and the second port;

(c) at least one selectable termination circuit, each coupled between circuit ground and a corresponding one of the first port or the second port; and (d) a distinct isolation circuit control signal, coupled to each selectable termination circuit, configured to switch the at least one termination circuit to an isolation mode to operationally couple the corresponding one of the first port or the second port to circuit ground, and to switch the at least one termination circuit to a phase shifting mode by de-coupling the corresponding one of the first port or the second port from circuit ground;

wherein, in the isolation mode, the plurality of independent path selection control signals are set to states that effect isolation of the corresponding phase shift signal path from the first port and the second port.

16. The phase shifter of claim 15, wherein the at least one selectable termination circuit includes a first selectable termination circuit coupled between circuit ground and the first port, and a second selectable termination circuit coupled between circuit ground and the second port.

17. The phase shifter of claim 15, wherein at least one phase shift signal path of the plurality of phase shift signal paths includes a first isolation switch serially coupled to one of the first port or the second port, at least one phase shifter element serially coupled to the first isolation switch, and a second isolation switch serially coupled to the at least one phase shifter element and to the other of the first port or the second port.

18. The phase shifter of claim 15, wherein at least one selectable termination circuit of the at least one selectable termination circuit is coupled between circuit ground and a corresponding one of the first port or the second port through at least one isolation switch.

19. The phase shifter of claim 15, wherein at least one selectable termination circuit of the at least one selectable termination circuit is coupled between circuit ground and a corresponding one of the first port or the second port through a corresponding phase shifter element.

20. The phase shifter of claim 15, wherein the distinct isolation circuit control signal is derived from a logical combination of the at least two independent path selection control signals.

* * * * *